United States Patent
Chen et al.

(10) Patent No.: US 7,235,129 B2
(45) Date of Patent: Jun. 26, 2007

(54) SUBSTRATE HAVING A ZINC OXIDE NANOWIRE ARRAY NORMAL TO ITS SURFACE AND FABRICATION METHOD THEREOF

(75) Inventors: I-Cherng Chen, Hsinchu (TW);
Yung-Kuan Tseng, Hsinchu (TW);
Chor-Jye Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 319 days.

(21) Appl. No.: 10/822,648

(22) Filed: Apr. 13, 2004

(65) Prior Publication Data
US 2005/0223969 A1    Oct. 13, 2005

(51) Int. Cl.
*C30B 21/04*    (2006.01)
(52) U.S. Cl. ............... 117/84; 117/86; 117/91; 117/94; 117/95; 117/96; 257/9
(58) Field of Classification Search ............... 117/84, 117/86, 91, 94, 95, 96; 257/9
See application file for complete search history.

(56) References Cited

U.S. PATENT DOCUMENTS

2002/0175408 A1* 11/2002 Majumdar et al. .......... 257/734
2003/0126742 A1* 7/2003 Ting et al. .................... 29/874
2004/0137214 A1* 7/2004 Chen et al. ................. 428/323
2005/0009224 A1* 1/2005 Yang et al. ................... 438/57
2005/0161662 A1* 7/2005 Majumdar et al. ............ 257/18
2005/0224779 A1* 10/2005 Wang et al. ................... 257/9
2005/0255629 A1* 11/2005 Han et al. ................... 438/104

OTHER PUBLICATIONS

Chiou et al., Growth of single crystal ZnO nanowires using sputter deposition, Science Direct, Diamond and related materials, vol. 12 issue 10-11 Oct.-Nov. 2003, online Sep. 5, 2003.*

* cited by examiner

*Primary Examiner*—Robert Kunemund
(74) *Attorney, Agent, or Firm*—Bacon & Thomas, PLLC

(57) ABSTRACT

A method for forming an array of zinc oxide nanowires on a substrate is disclosed, which includes forming a crystal phase adjusting buffer on the surface of the substrate and growing 1D zinc oxide nanowires on the buffer by zinc vapor deposition, which are normal to the surface of the substrate. The crystal phase adjusting buffer includes, for example, nitride and oxide layers on a silicon substrate, or a gallium nitride epitaxial layer on a sapphire substrate, and is used as a growth buffer layer for the zinc oxide nanowires. The zinc vapor phase deposition includes forming a zinc oxide layer on the crystal phase adjusting buffer and forming vertical zinc oxide nanowires on the zinc oxide layer.

20 Claims, 3 Drawing Sheets

SUBSTRATE HAVING A ZINC OXIDE NANOWIRE ARRAY NORMAL TO ITS SURFACE AND FABRICATION METHOD THEREOF

BACKGROUND OF THE INVENTION

1. Field of the Invention

The present invention relates to a vertical zinc oxide nanowire array on a substrate, and a related fabrication method. More particularly, the present invention discloses a method for forming an array of zinc oxide nanowires during a semiconductor process, which may be utilized to design an optoelectronic device with nano structure characteristics.

2. Description of the Related Art

U.S. Pat. No. 5,897,945 discloses metal oxide nanorods, and composite materials containing such nanorods. The metal oxide nanorods have diameters between 1 and 200 nm, and aspect ratios between 5 and 2000.

U.S. Pat. No. 6,036,774 discloses methods of preparing metal oxide nanorods. The metal oxide nanorods have diameters between 1 and 200 nm and aspect ratios between 5 and 2000. The methods include the steps of generating a metal vapor in a furnace, exposing the nanorod growth substrate to the metal vapor within a growth zone in the furnace for a sufficient time to grow metal oxide nanorods on a surface of the nanorod growth substrate, removing the nanorod growth substrate from the growth zone after the sufficient time to grow metal oxide nanorods on a surface of the nanorod growth substrate has elapsed, and removing the metal oxide nanorods from the furnace. The methods can be used to prepare large quantities of metal oxide nanorods.

It is desirable, however, to provide an improved method for generating a zinc oxide nanowire array on a substrate.

SUMMARY OF THE INVENTION

A main objective of the present invention is to provide a simplified zinc oxide nanowire process, and a method for forming an array of zinc oxide nanowires during a semiconductor process. The present invention provides a substrate having a zinc oxide nanowire array normal to its surface, and discloses a fabrication method thereof. The fabrication method uses surface crystal phase characteristic adjustment and a process compatible with semiconductor and optoelectronic industry processes, instead of the vapor-liquid-solid deposition process using a catalyst implantation. In the other words, the present invention uses a common silicon wafer having a crystal orientation of <100> or a sapphire substrate, and a low temperature vapor deposition process (lower than or close to 550° C.) to form vertical zinc oxide nanowires on the zinc oxide layer. The first method grows a compound layer having an oxide layer, a silicon nitride layer and a doped zinc oxide layer to change the crystal lattice characteristic, and cooperates with growth condition controls of a simple zinc vapor deposition process to grow a zinc oxide layer on the compound layer of the silicon substrate. Then, by adjusting furnace vapor reaction conditions, vertical zinc oxide nanowires are grown on the zinc oxide layer. The second method grows a gallium nitride epitaxial layer on a sapphire substrate to change surface crystal phase characteristics and cooperate with the same zinc vapor deposition process to grow 1D zinc oxide nanowires vertical to the substrate.

In order to achieve the above-mentioned objectives, in the present invention, a substrate with a vertical zinc oxide nanowire array includes:

a substrate;
a crystal phase adjusting buffer on a surface of the substrate; and
a nanowire compound layer;
wherein the nanowire compound layer comprises a zinc oxide layer on the crystal phase adjusting buffer, a vertical zinc oxide nanowire array on the zinc oxide layer, and the zinc oxide nanowires have diameters of 15-500 nm and aspect ratios of 3-300.

the substrate is a single crystal, polycrystal or amorphous substrate with micrometer or nano-sized pores, or an irregular surface structure, such as sapphire, magnesia, lithium niobate, strontium titanate, barium titanate, aluminum oxide, quartz, zirconia, glass or a silicon wafer.

Preferably, the crystal phase adjusting buffer is a single or multiple layer film made of metal, oxide or nitride.

Preferably, the substrate is a silicon wafer, the crystal phase adjusting buffer comprises a silicon dioxide layer, a silicon nitride layer and a doped zinc oxide layer, with respective thickness of 0.01-1 micrometers, 0.01-1 micrometers and 0.01-10 micrometers. The doped zinc oxide layer in the crystal phase adjusting buffer comprises a doping element selected from the group consisting of Al, Ga, Si, Ge, B, Ti, Sn, Mg, In, Cr, P and Zn.

Preferably, the substrate is a sapphire substrate, and the crystal phase adjusting buffer is a gallium nitride epitaxial layer with a thickness of 0.01-10 micrometers.

Preferably, the zinc oxide layer of the nanowire compound layer has a thickness of 0.2-12 micrometers.

The present invention further provides a method for forming an array of zinc oxide nanowires on a substrate, which includes:

a) forming a crystal phase adjusting buffer on the surface of the substrate; and b) growing 1D zinc oxide nanowires on the crystal phase adjusting buffer, which comprises: b1) generating a zinc vapor in a first vacuum chamber and exposing the substrate with the crystal phase adjusting buffer to the zinc vapor to grow a zinc oxide layer on the crystal phase adjusting buffer; and b2) generating another zinc vapor in a second vacuum chamber and exposing the substrate with the zinc oxide layer to the zinc vapor to form vertical zinc oxide nanowires on the zinc oxide layer, the zinc oxide nanowires having diameters of 15-500 nm and aspect ratios between 3-300.

In this method, step b1) process conditions include: a vacuum value of the first vacuum chamber being 1-300 Torr; a heating temperature for generating the zinc vapor in the first vacuum chamber being 400° C.~550° C.; argon gas at 50-200 sccm flowing through the first vacuum chamber having 0.1-5% by volume of moisture and oxygen; and a reaction time between 1~60 minutes; wherein the substrate is placed a downstream position in the argon gas flow, relative to where the zinc vapor is generated, and with a temperature difference from the heating temperature by −80~100° C.

In this method, step b2) process conditions include: a vacuum value of the second vacuum chamber is 1-300 Torr; a heating temperature for generating the zinc vapor in the second vacuum chamber being 480° C.~600° C.; argon gas at 20-100 sccm flowing through the second vacuum chamber having 1-20% by volume of moisture and oxygen; and a reaction time between 10~120 minutes; wherein the substrate is placed at a downstream position in the argon gas flow, relative to where the zinc vapor is generated, and with a temperature difference from the heating temperature by −80~100° C.

Preferably, in both steps b1) and b2) the zinc vapor is generated by heating metal zinc in the form of powder, wire or block; or by heating zinc oxide powder in a reduction atmosphere.

Preferably, in both steps b1) and b2) the zinc vapor is generated by heating diethylzinc gas, solid of zinc acetyl acetonate salt which can be sublimated, zinc acetate, zinc 2-ethyl-hexanoate or zinc alkoxide salts.

Preferably, in both steps b1) and b2) the first vacuum chamber and the second vacuum chamber are the same vacuum chamber.

Other objects, advantages, and novel features of the invention will become more apparent from the following detailed description when taken in conjunction with the accompanying drawings.

DETAILED DESCRIPTION OF THE PREFERRED EMBODIMENT

In the present invention, the method of growing a vertical zinc oxide nanowire array utilizes a furnace vapor deposition process, high purity metal zinc steam and low oxide atmospheric control. In this first embodiment, a silicon wafer substrate with a crystal orientation of <100> was employed. A compound layer was grown on its surface. The compound layer comprised a silicon dioxide layer with a thickness of 0.1 µm, which was grown on the substrate by a hot oxidation process. A silicon nitride layer with a thickness of 0.1 µm was grown on the silicon dioxide layer by a PE-CVD process, and an aluminum doped zinc oxide layer with a thickness of 0.5 µm. This Al doping/ZnO/$Si_3N_4$/$SiO_2$/Si compound layer was placed in a back end of a quartz pipe in a heater. Zinc oxide (99.999%, 350 mesh, Strem Chemicals) and metal zinc powder (99.999%, 350 mesh, Strem Chemicals) were mixed together 1:1 mole ratio, and moved into an aluminum oxide crucible to be placed in a middle section of the quartz pipe away from the compound substrate by about 20-35 mm. A mechanical pump was employed to set the pressure in the quartz pipe becomes to 10 Torr. The heater used a controller to raise the temperature 20° C. every minute until 500° C. was reached. Argon gas at 54 sccm and oxygen at 0.1 sccm were introduced into a front end of the quartz pipe, and the reaction was allowed to perform for 3 minutes to grow a flat zinc oxide layer on the compound layer of the silicon substrate. The process conditions were then changed to allow Argon gas at 35 sccm and oxygen at 5 sccm; the temperature was raised to 550° C., and the reaction time set for 30 minutes. After the reaction had completed and the heater cooled down, a vertical zinc oxide nanowire array had grown on the silicon wafer compound substrate.

Second Embodiment

In this embodiment, a single crystal sapphire substrate with a crystal orientation of <100> was provided. The substrate surface was pre-grown with an n-type gallium nitride epitaxial layer with an epitaxy thickness of 1.5 µm (as utilized for manufacturing by some LED companies), and then this n type gallium nitride epitaxial layer/sapphire single crystal compound substrate was processed followed the steps outlined in the first embodiment to grow a vertical needle zinc oxide nanowire array.

A crystal analysis examination for the zinc oxide nanowires employs an XRD. The nanowire structure was observed by a FESEM, LEO 1530, operated in the 5 keV working voltage range). Then, an HRTEM was employed to observe the material structure of the zinc oxide nanowires.

Figure 1:
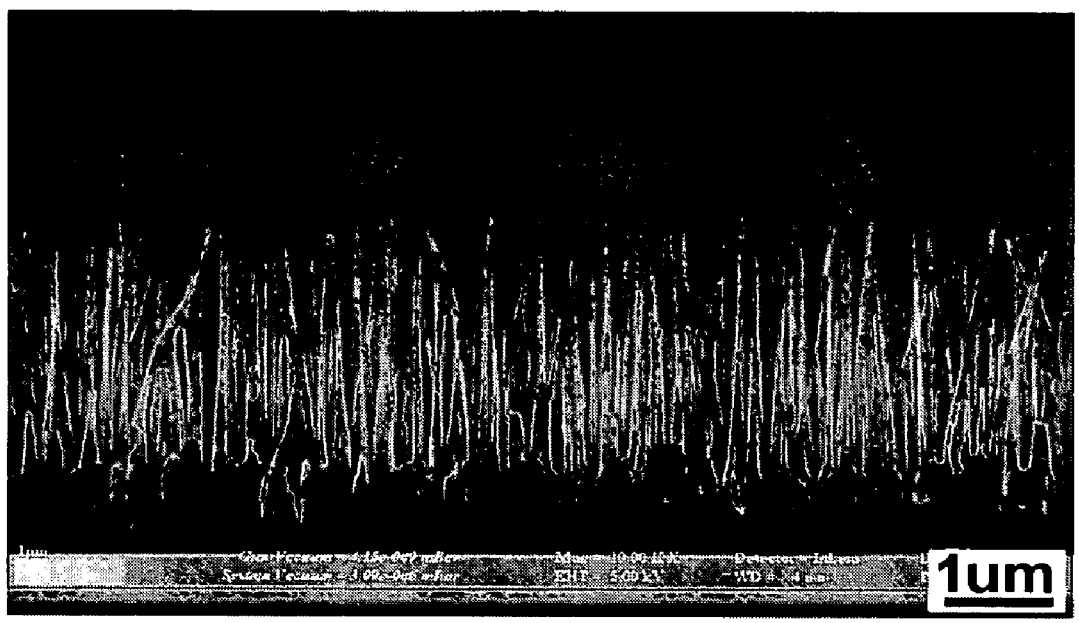
FIG. 1 is a field-emission scanning electron microscopy (FESEM) image showing a side view of a needle zinc oxide nanowire structure according to a first embodiment of the present invention.
Figure 2:
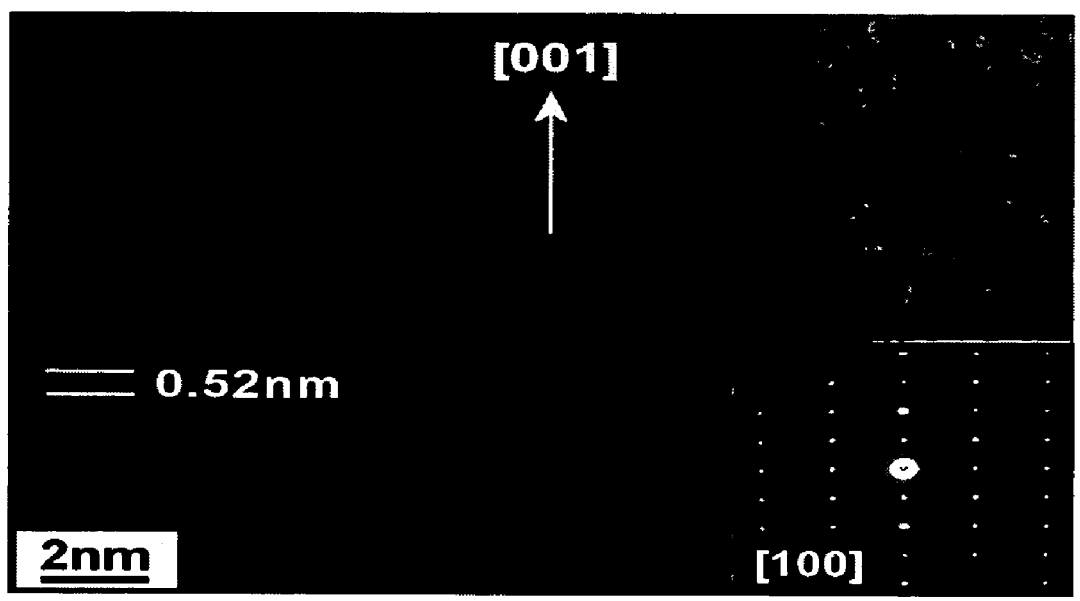
FIG. 2 is a high-resolution TEM (HRTEM) image of an individual zinc oxide nanowire showing its [001] growth direction according to the first embodiment of the present invention. The inset shows the corresponding selected-area electron diffraction pattern from the nanowires.

FIG. 1 is a FESEM photo of a needle zinc oxide nanowire structure according to a first embodiment, which shows a flat zinc oxide layer grown on the silicon wafer compound substrate, and a vertical needle zinc oxide nanowire array grown on the flat zinc oxide layer. FIG. 2 shows an HRTEM image of observing a crystal lattice edge of the needle zinc oxide nanowire structure in the first embodiment, and an electron diffraction drawing of its corresponding selected area, which shows that a single needle zinc oxide nanowire is a single 1D nano crystal in a perfect <100> growth direction.

Figure 3:
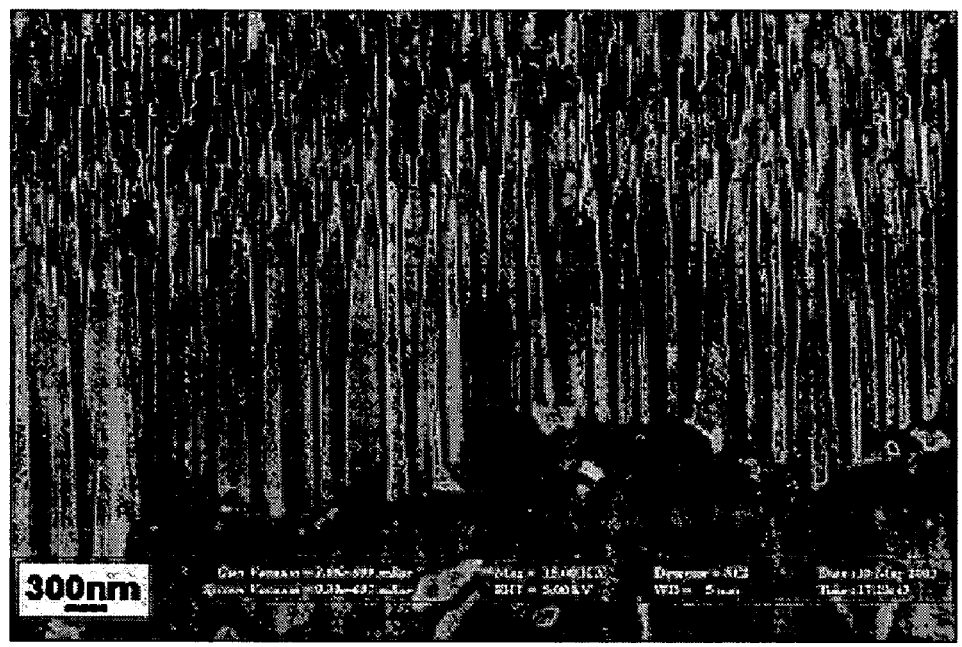
FIG. 3 is a FESEM image showing a perspective view of a needle zinc oxide nanowire structure according to a second embodiment of the present invention.
Figure 4:
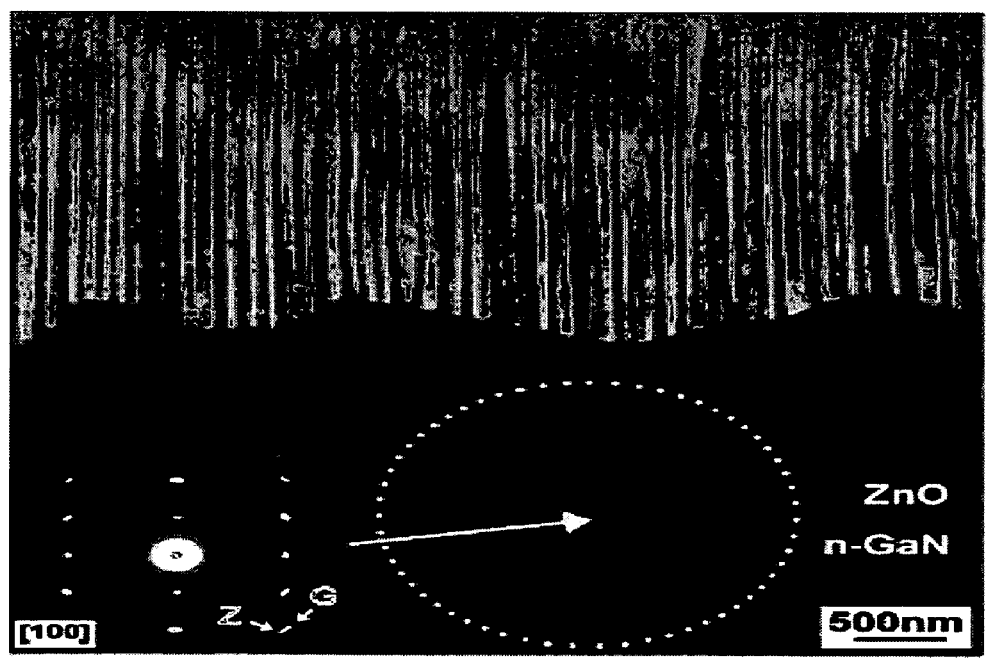
FIG. 4 is an HRTEM image of the cross-sectional sample of needle zinc oxide nanowires grown according to the second embodiment of the present invention. The inset shows the corresponding selected-area electron diffraction pattern from the nanowires.

FIG. 3 is a FESEM photo of a needle zinc oxide nanowire structure according to the second embodiment, which shows a flat zinc oxide layer grown on the sapphire single crystal compound substrate, and a vertical needle zinc oxide nanowire array grown on the flat zinc oxide layer. FIG. 4 shows an HRTEM image of observing a crystal lattice edge of the needle zinc oxide nanowire structure of the second embodiment, and an electron diffraction drawing of its corresponding selected area, which shows the vertical needle zinc oxide nanowire array grown on the flat zinc oxide layer above the n type gallium nitride epitaxial layer/sapphire single crystal compound substrate.

Figure 5:
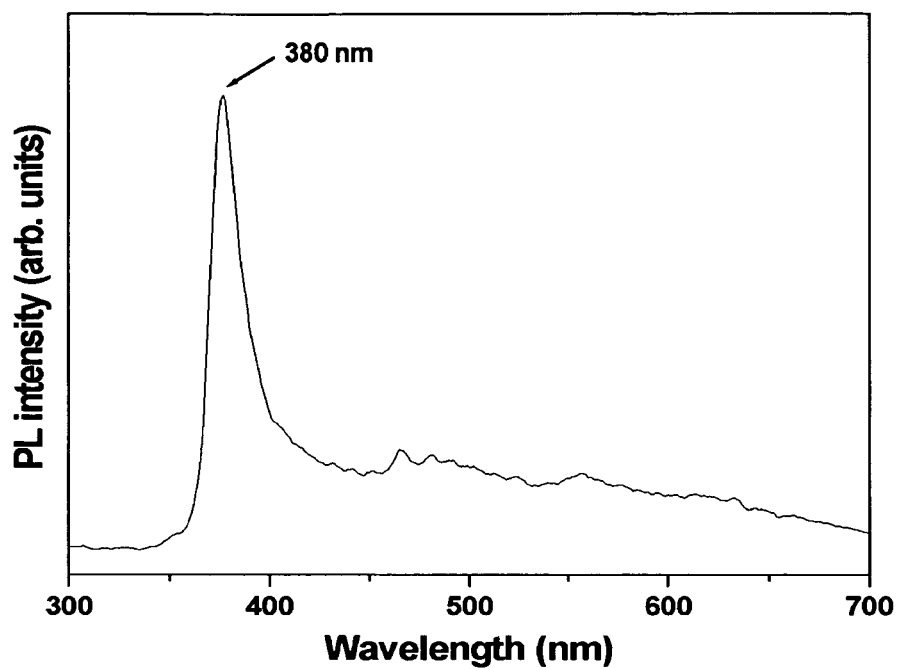
FIG. 5 shows a photoluminescence (PL) emission spectrum of a needle zinc oxide nanowire structure of the first embodiment when excited by UV light having a wavelength of 254 nm to generate a pick with a wavelength of 380 nm.

FIG. 5 shows a PL emission spectrum of the needle zinc oxide nanowire array structure in the first embodiment being excited by UV light with a wavelength of 254 nm to generate a pick with a wavelength of 380 nm.

Figure 6:
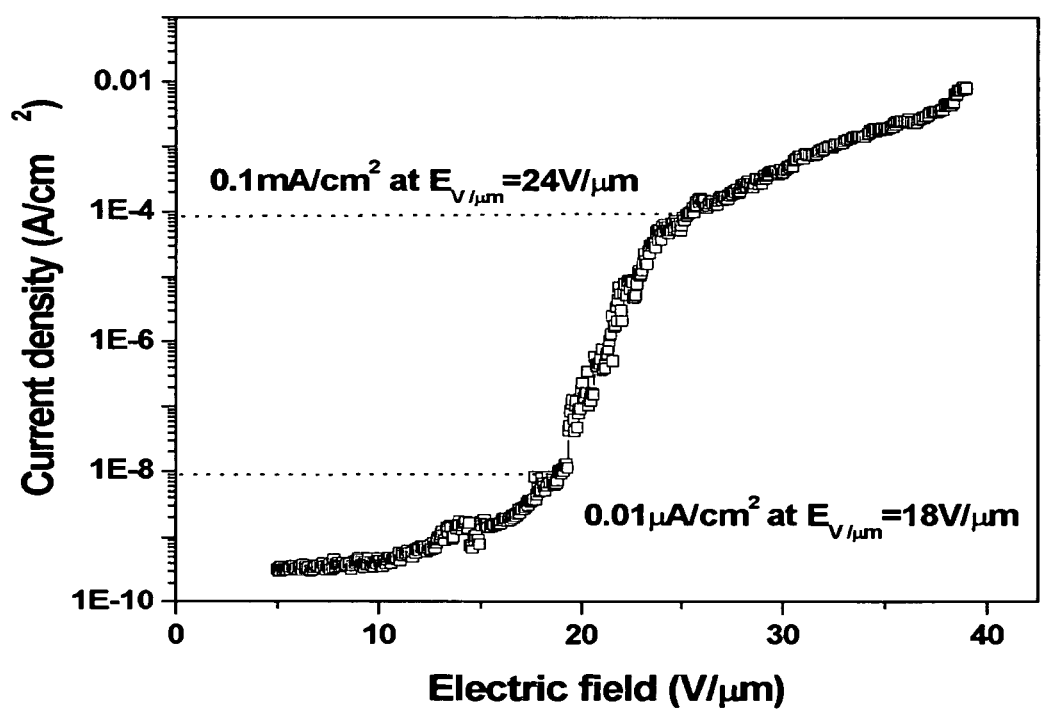
FIG. 6 shows field emission characteristics of a needle zinc oxide nanowire structure of the first embodiment.

A sample with the zinc oxide nanowire array structure was placed on a fixed electrode seat. A diffusion pump was employed to control the vacuum in a reaction system, and a distance between the electrode and the needle zinc oxide nanowires was changed to adjust a voltage to measure the field emission characteristics. FIG. 6 shows field emission characteristics of the needle zinc oxide nanowire structure of the first embodiment.

The present invention uses a crystal phase control buffer to change surface crystal characteristics on a substrate for growing a zinc oxide nanowire array. The substrate can be single crystal, polycrystal or an irregular heat-resistant substrate with an amorphous phase, and lithography technology can be used to pattern the crystal phase control buffer to grow a patterned nanowire array for a subsequent application or device.

Although the present invention has been explained in relation to its preferred embodiment, it is to be understood that many other possible modifications and variations can be made without departing from the spirit and scope of the invention as hereinafter claimed.

What is claimed is:

1. A substrate with a vertical zinc oxide nanowire array comprising:
   a substrate;
   a crystal phase adjusting buffer on a surface of the substrate, wherein the crystal phase adjusting buffer is a single or multiple layer film made of oxide or nitride; and
   a nanowire compound layer;
   wherein the nanowire compound layer comprises a zinc oxide layer on the crystal phase adjusting buffer, a vertical zinc oxide nanowire array on the zinc oxide layer, and zinc oxide nanowires of said array have diameters of 15-500 nm and aspect ratios of 3-300.

2. The substrate as claimed in claim 1 wherein the substrate is a single crystal, polycrystal or amorphous substrate with micrometer or nano-sized pores, or an irregular surface structure.

3. The substrate as claimed in claim 2 wherein the substrate is sapphire, magnesia, lithium niobate, strontium titanate, barium titanate, aluminum oxide, quartz, zirconia, glass or a silicon wafer.

4. The substrate as claimed in claim 1 wherein the substrate is a silicon wafer, the crystal phase adjusting buffer comprises a silicon dioxide layer on said silicon wafer, a silicon nitride layer on said silicon dioxide layer and a doped zinc oxide layer on said silicon nitride layer, with respective thicknesses of 0.01-1 micrometers, 0.01-1 micrometers and 0.01-10 micrometers.

5. The substrate as claimed in claim 4 wherein the doped zinc oxide layer in the crystal phase adjusting buffer comprises a doping element selected from the group consisting of Al, Ga, Si, Ge, B, Ti, Sn, Mg, In, Cr, P and Zn.

6. The substrate as claimed in claim 1 wherein the substrate is a sapphire substrate, and the crystal phase adjusting buffer is a gallium nitride epitaxial layer with a thickness of 0.01-10 micrometers.

7. The substrate as claimed in claim 1 wherein the zinc oxide layer of the nanowire compound layer has a thickness of 0.2-12 micrometers.

8. A method for forming an array of zinc oxide nanowires on a substrate comprising:
   a) forming a crystal phase adjusting buffer on the surface of the substrate; and
   b) growing 1D zinc oxide nanowires on the crystal phase adjusting buffer, which comprises:
   b1) generating a zinc vapor in a first vacuum chamber and exposing the substrate with the crystal phase adjusting buffer to the zinc vapor to grow a zinc oxide layer on the crystal phase adjusting buffer; and b2) generating another zinc vapor in a second vacuum chamber and exposing the substrate with the zinc oxide layer to the zinc vapor to form vertical zinc oxide nanowires on the zinc oxide layer, the zinc oxide nanowires having diameters of 15-500 nm and aspect ratios between 3-300.

9. The method as claimed in claim 8 wherein step b1) process conditions include: a vacuum value of the first vacuum chamber being 1-300 Torr; a heating temperature for generating the zinc vapor in the first vacuum chamber being 400° C.~550° C.; argon gas at 50-200 sccm flowing through the first vacuum chamber having 0.1-5% by volume of moisture or oxygen; and a reaction time between 1~60 minutes; wherein the substrate is placed at a downstream position in the argon gas flow, relative to where the zinc vapor is generated, and with a temperature difference from the heating temperature by −80~100° C.

10. The method as claimed in claim 8 wherein step b2) process conditions include: a vacuum value of the second vacuum chamber is 1-300 Torr; a heating temperature for generating the zinc vapor in the second vacuum chamber being 480° C.~600° C.; argon gas at 20-100 sccm flowing through the second vacuum chamber having 1-20% by volume of moisture or oxygen; and a reaction time between 10~120 minutes; wherein the substrate is placed at a downstream position in the argon gas flow, relative to where the zinc vapor is generated, and with a temperature difference from the heating temperature by −80~100° C.

11. The method as claimed in claim 8 wherein in both steps b1) and b2) the zinc vapor is generated by heating metal zinc in the form of powder, wire or block; or by heating zinc oxide powder in a reduction atmosphere.

12. The method as claimed in claim 8 wherein in both steps b1) and b2) the zinc vapor is generated by heating diethylzinc gas, solid of zinc acetyl acetonate salt which can be sublimated, zinc acetate, zinc 2-ethyl-hexanoate or zinc alkoxide salts.

13. The method as claimed in claim 8 wherein in both steps b1) and b2) the first vacuum chamber and the second vacuum chamber are the same vacuum chamber.

14. The method as claimed in claim 8 wherein the substrate is a single crystal, polycrystal or amorphous substrate with micrometer or nano-sized pores, or an irregular surface structure.

15. The method as claimed in claim 14 wherein the substrate is sapphire, magnesia, lithium niobate, strontium titanate, barium titanate, aluminum oxide, quartz, zirconia, glass or a silicon wafer.

16. The method as claimed in claim 8 wherein the crystal phase adjusting buffer is a single or multiple layer film made of metal, oxide or nitride.

17. The method as claimed in claim 8 wherein the substrate is a silicon wafer, the crystal phase adjusting buffer comprises a silicon dioxide layer, a silicon nitride layer and a doped zinc oxide layer, with respective thicknesses of 0.01-1 micrometers, 0.01-1 micrometers and 0.01-10 micrometers.

18. The method as claimed in claim 17 wherein the doped zinc oxide layer in the crystal phase adjusting buffer comprises a doping element selected from the group consisting of Al, Ga, Si, Ge, B, Ti, Sn, Mg, In, Cr, P and Zn.

19. The method as claimed in claim 8 wherein the substrate is a sapphire substrate, and the crystal phase adjusting buffer is a gallium nitride epitaxial layer with a thickness of 0.01-10 micrometers.

20. The method as claimed in claim 8, wherein the zinc oxide layer of the nanowire compound layer has a thickness of 0.2-12 micrometers.

* * * * *